(12) United States Patent
Yang

(10) Patent No.: US 10,897,237 B1
(45) Date of Patent: Jan. 19, 2021

(54) FILTER FOR SUPPRESSING 5G SIGNAL INTERFERENCE AND TELEVISION ANTENNA

(71) Applicant: SHENZHEN ANTOP TECHNOLOGY CO., LTD., Guangdong (CN)

(72) Inventor: Ruidian Yang, Shenzhen (CN)

(73) Assignee: SHENZHEN ANTOP TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/600,791

(22) Filed: Oct. 14, 2019

(30) Foreign Application Priority Data

Sep. 11, 2019 (CN) .......................... 2019 1 0859306
Sep. 11, 2019 (CN) ...................... 2019 2 1517294 U

(51) Int. Cl.
*H04B 1/00* (2006.01)
*H03H 7/01* (2006.01)
*H05K 7/14* (2006.01)

(52) U.S. Cl.
CPC ........ *H03H 7/0115* (2013.01); *H03H 7/1766* (2013.01); *H05K 7/1427* (2013.01)

(58) Field of Classification Search
CPC ... H04B 1/28; H04B 1/38; H04B 1/48; H04B 15/04; H03H 7/0115; H03H 2007/13; H03H 7/1766; H05K 7/1427; H05K 7/1428
See application file for complete search history.

(56) References Cited

U.S. PATENT DOCUMENTS

| 2020/0021030 | A1* | 1/2020 | Bates | H01P 11/008 |
| 2020/0076031 | A1* | 3/2020 | Nam | H04B 15/04 |
| 2020/0076078 | A1* | 3/2020 | Tehran | H01Q 5/35 |
| 2020/0136588 | A1* | 4/2020 | Alicioglu | H03H 7/19 |

FOREIGN PATENT DOCUMENTS

| CN | 104883151 A | 9/2015 |
| CN | 108155883 A | 6/2018 |

* cited by examiner

*Primary Examiner* — Thanh C Le
(74) *Attorney, Agent, or Firm* — Pearne & Gordon LLP

(57) ABSTRACT

A filter for suppressing 5G signal interference comprises a high-frequency filter circuit that uses a coil hung and disposed in a conductive isolating cavity as an inductor and that uses a combination of the conductive isolating cavity, dielectrics in the conductive isolating cavity, and the coil as a capacitor. A new-type filter circuit comprises a conductive isolating cavity, dielectrics in the conductive isolating cavity, and a coil hung and disposed in the conductive isolating cavity. The coil itself is an inductor in a high-frequency filter circuit, the coil and the conductive isolating cavity further form two conductors close to each other, and air media in relatively small space between the two conductors form non-conductive insulated media, to jointly form a new-type capacitor. That is, the coil in the high-frequency filter circuit is both an inductor and a conductor that forms a capacitor.

10 Claims, 5 Drawing Sheets ved Q values of such LC elements are not high, and an adjacent-frequency suppression effect is poor, basically two or more adjacent-frequency bandwidths are sacrificed. Needs of users cannot be met.

For this reason, a filter for effectively filtering out a 5G signal is necessary.

FILTER FOR SUPPRESSING 5G SIGNAL INTERFERENCE AND TELEVISION ANTENNA

TECHNICAL FIELD

The present invention relates to the field of antenna equipment technologies, and more specifically, to a filter for suppressing 5G signal interference and a television antenna.

BACKGROUND ART 5G is the latest generation of cellular mobile communication technology and is also an extension after 4G (LTE-A, WiMax) systems, 3G (UMTS, LTE) systems, and 2G (GSM) systems. 5G mobile networks are like the early 2G, 3G and 4G mobile networks, and 5G networks are digital cellular networks in which a service area covered by a provider is divided into many small geographical areas referred to as cells. Analog signals representing sound and images are digitized in a mobile phone, and are converted by an analog-to-digital converter and transmitted as a bit stream. All 5G wireless devices in the cells communicate with local antenna arrays and low-power automatic transceivers (transmitters and receivers) in the cells via radio waves. The transceivers are assigned channels from a common frequency pool, and the channels can be reused in geographically separated cells. Local antennas are connected to telephone networks and the Internet via a high-bandwidth fiber or a wireless backhaul connection. As with existing mobile phones, when users cross from one cell to another cell, the users' mobile devices may be automatically "handed over" to an antenna in the new cell. A main advantage of a 5G network is that a data transmission rate of the 5G network is much higher than a data transmission rate of a previous cellular network, and is up to 10 Gbit/s, which is faster than a current wired Internet and 100 times faster than a previous 4G LTE cellular network. Another advantage of the 5G network is a lower network latency (shorter response time) less than 1 millisecond, while a network latency of 4G is 30 milliseconds to 70 milliseconds. Due to faster data transmission, 5G networks may not only serve mobile phones, but also become general home and office network providers, competing with wired network providers. Previous cellular networks provide low data rate Internet access applicable to mobile phones, but a mobile phone tower cannot economically provide enough bandwidth as a general Internet provider for home computers. Performance goals of 5G are increasing a data rate, reducing a latency, saving energy, reducing costs, increasing a system capacity, and establishing large-scale device connectivity.

With the development, maturity, and application of the 5G technology, interference from the 5G technology with original low-frequency signals such as television signals is bound to become a technical problem that cannot be ignored. Foreign countries (especially Europe and America) have classified a frequency band range of 700 MHz to 800+ MHz as 5G frequency bands. Therefore, for foreign markets, it is necessary to study suppression of 5G signal interference above 700 MHz. There are some studies abroad about design of suppressing 5G signal interference above 700 MHz, and the studies are mainly in the following two directions: One is done with a cavity filter. In this design, a housing is relatively large, the requirement on an adjustable capacitance index is strict and high in costs, and debugging is difficult and high in costs. The other is done with an ordinary inductor or capacitor. Although LC filtering is low in costs,

SUMMARY OF THE INVENTION

In view of this, in order to overcome at least one of the above drawbacks in the prior art, the present invention provides a filter for suppressing 5G signal interference, and solves a problem that an existing filter has a poor suppression effect on 5G signals, is of a large volume, and is high in costs.

In order to solve the above existing technical problem, the following technical solution is used in the present invention.

A filter for suppressing 5G signal interference comprises a high-frequency filter circuit that uses a coil hung and disposed in a conductive isolating cavity as an inductor and that uses a combination of the conductive isolating cavity, dielectrics in the conductive isolating cavity, and the coil as a capacitor.

The present invention provides a new-type filter circuit, comprising a conductive isolating cavity, dielectrics in the conductive isolating cavity, and a coil hung and disposed in the conductive isolating cavity. The coil itself is an inductor in a high-frequency filter circuit. In addition, the coil and the conductive isolating cavity further form two conductors close to each other, and air media or other types of dielectrics in relatively small space between the two conductors form non-conductive insulated media, to jointly form a new-type capacitor. In brief, the coil in the high-frequency filter circuit is both an inductor and a conductor that forms a capacitor. A distribution parameter formed by using the coil, the conductive isolating cavity, and the dielectrics in the conductive isolating cavity is capacitance. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the capacitor is much less than a volume of a cavity filter, which meets a need of miniaturization development of a filter; and the high-frequency filter circuit can be easily debugged by adjusting tension of the coil, and difficulty of the debugging is low and costs of the debugging are much lower than costs of debugging the cavity filter. The dielectrics are most preferably air media which have a simple production process and low costs. In addition, the dielectrics may be plastic cement, PVC, ceramics, or the like.

Specifically, the conductive isolating cavity is formed by a conductive housing having an avoidance hole, and the coil is hung and disposed in the housing and is connected to the outside of the conductive housing through the avoidance hole. The coil may be partially extended to the outside of the conductive housing through the avoidance hole to be connected to a signal source, or may be connected to a signal source outside the conductive housing by using a conductor such as a conducting wire through the avoidance hole, and the conducting wire may be connected to any location of the coil, for example, the middle of the coil or an end part of the coil.

To achieve a better suppression effect, the filter for suppressing 5G signal interference comprises several high-frequency filter circuits connected in parallel, so that resonance frequency of each high-frequency filter circuit is around 700 MHz, and the resonance frequencies of each of the high-frequency filter circuits are slightly different, thereby facilitating in further improving a 5G suppression effect.

When a plurality of high-frequency filter circuits are connected in parallel, a plurality of the above specific structures may be connected one by one in parallel to a transmission line connected to the signal source. This manner makes installation of a filter more flexible, but in many cases, the installation appears relatively loose. Therefore, the present invention provides a specific structure of a filter in which a plurality of high-frequency filter circuits are connected in parallel: comprising a conductive housing having two avoidance holes, conductive separators that separate the conductive housing into several conductive isolating cavities, and a circuit board having a transmission line crossing several conductive isolating cavities, a coil of each high-frequency filter circuit being disposed in each conductive isolating cavity with one end being connected to the transmission line, and two ends of the transmission line being separately connected to the outside of the conductive housing through the two avoidance holes.

The two ends of the transmission line are respectively a signal input end and a signal output end, and the signal output end or a location on the transmission line close to the signal output end is further connected to an LC filter circuit. An LC filter circuit being added after the high-frequency filter circuit can then filter out a high frequency lower than a frequency of a 5G signal, which helps to improve signal quality. Preferably, the LC filter circuit is a low-pass filter circuit, comprising several parallel resonance circuits connected in series. A low-pass filter circuit being added after the high-frequency filter circuit can then filter out frequencies above 750 MHz, which helps to achieve a signal of higher quality.

The circuit board further has a grounding line wound and disposed round an edge of the circuit board, the grounding line being connected to the conductive housing, to ensure that the circuit board and the conductive housing are properly grounded.

In addition, the present invention further provides a specific structure of another filter in which a plurality of high-frequency filter circuits are connected in parallel: comprising a conductive housing having two avoidance holes, conductive separators that separate the conductive housing into several conductive isolating cavities, and a transmission wire crossing several conductive isolating cavities, a coil of each high-frequency filter circuit being disposed in each conductive isolating cavity with one end being connected to the transmission wire, and two ends of the transmission wire being separately connected to the outside of the conductive housing through the two avoidance holes. The two ends of the transmission wire are respectively a signal input end and a signal output end, and the signal output end is further connected to an LC filter circuit. An LC filter circuit being added after the high-frequency filter circuit can then filter out a high frequency lower than a frequency of a 5G signal, which helps to improve signal quality. Preferably, the LC filter circuit is a low-pass filter circuit, comprising several parallel resonance circuits connected in series. A low-pass filter circuit being added after the high-frequency filter circuit can then filter out frequencies above 750 MHz, which helps to achieve a signal of higher quality.

A wire diameter of the coil is 0.5 mm to 1.2 mm, and an inter-loop diameter of the coil is 3 mm to 6 mm. The use of a thick coil is not only advantageous for further improving a suppression effect, but also for obtaining a high-Q value high-frequency filter circuit. Preferably, a copper coil is used for the coil. The number of turns of the coil is 5 to 13, preferably, the number of turns of the coil is 6 to 9, and a small number of turns leads to a larger diameter of the coil. It is found that a larger number of turns of the coil lead to a lower resonance frequency and a poorer received antenna signal, and in such a case, even no antenna signal can be received, and an optimal filtering effect can be achieved by designing the number of turns of the coil to 9; and if the number of turns of the coil is too small, frequencies above 700 MHz cannot be filtered out, so that 5G signal interference cannot be suppressed. When the number of turns of the coil is within the above range, a television signal can be effectively received and 5G signal interference can be effectively suppressed.

The present invention further provides a television antenna, comprising an antenna radiator and the above filter for suppressing 5G signal interference. The filter for suppressing 5G signal interference according to the present invention can be internally or externally arranged and connected to the antenna radiator receiving a television signal, and interference from a 5G signal with the television signal can be suppressed, so that a user can effectively receive a smooth television signal in a 5G environment.

Compared with the prior art, the present invention has the following beneficial effects: The present invention provides a new-type filter circuit, comprising a conductive isolating cavity and a coil hung and disposed in the conductive isolating cavity. The coil itself is a resonance inductor in a high-frequency filter circuit. In addition, the coil and the conductive isolating cavity further form two conductors close to each other, air media in relatively small space between the two conductors form non-conductive insulated media, to jointly form a resonance capacitor of a high-frequency filter circuit which is equivalent to a new-type capacitor. In brief, the coil in the high-frequency filter circuit is both a resonance inductor and a resonance conductor that forms a capacitor. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the resonance capacitor is much less than a volume of a cavity filter, which meets a requirement of miniaturization development of a filter; and the high-frequency filter circuit can be easily debugged by adjusting tension of the coil, and difficulty of the debugging is low and costs of the debugging are much lower than costs of debugging the cavity filter. A copper thick coil with a wire diameter of 0.5 to 1.2 mm and a ring diameter of 3 to 6 mm is used for the coil, so that an inductance Q value is greatly improved, and the coil and the conductive isolating cavity form a high-Q value high-frequency filter circuit. A plurality of high-frequency filter circuits are connected in parallel, so that resonance frequency of each high-frequency filter circuit is around 700 MHz, and the resonance frequencies of each of the high-frequency filter circuits are slightly different, thereby facilitating in further improving a 5G suppression effect. A low-pass filter circuit being added after several high-frequency filter circuits connected in parallel can then filter out frequencies above 750 MHz.

Figure 1:
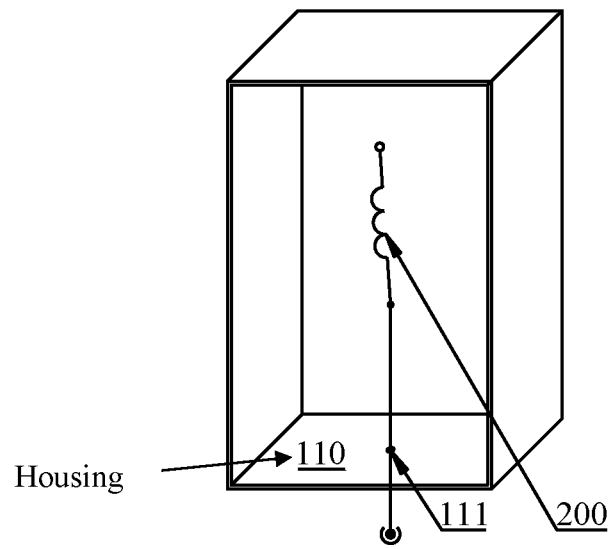
FIG. 1 is a schematic diagram of a filter for suppressing 5G signal interference according to Embodiment 1.

List of Reference numerals: a conductive housing 110, an avoidance hole 111, a conductive separator 120, a coil 200, a circuit board 300, a transmission line 310, a grounding line 320, a low-pass filter circuit 400, and a transmission wire 500.

DETAILED DESCRIPTION OF EMBODIMENTS

The accompanying drawings are merely for exemplary illustration and are not to be construed as limiting the present invention. For better illustration of the embodiments, some components in the accompanying drawings may be omitted, scaled up, or scaled down, which does not represent a size of an actual product. It may be understood by a person skilled in the art that some well-known structures and illustration thereof may be omitted in the accompanying drawings. The illustration about location relationships in the accompanying drawings are merely for exemplary illustration and are not to be construed as limiting the present invention. The present invention is further illustrated below in conjunction with specific embodiments.

Embodiment 1

As shown in FIG. 1, a filter for suppressing 5G signal interference comprises a high-frequency filter circuit that uses a coil 200 hung and disposed in a conductive isolating cavity as an inductor and that uses a combination of the conductive isolating cavity, dielectrics in the conductive isolating cavity, and the coil 200 as a capacitor.

This embodiment provides a new-type filter circuit, comprising a conductive isolating cavity, dielectrics in the conductive isolating cavity, and a coil 200 hung and disposed in the conductive isolating cavity. The coil 200 itself is an inductor in a high-frequency filter circuit. In addition, the coil 200 and the conductive isolating cavity further form two conductors close to each other, and air media or other types of dielectrics in relatively small space between the two conductors form non-conductive insulated media, to jointly form a new-type capacitor. In brief, the coil 200 in the high-frequency filter circuit is both an inductor and a conductor that forms a capacitor. A distribution parameter formed by using the coil, the conductive isolating cavity, and the dielectrics in the conductive isolating cavity is capacitance. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the capacitor is much less than a volume of a cavity filter, which meets a need of miniaturization development of a filter; and the high-frequency filter circuit can be easily debugged by adjusting tension of the coil 200, and difficulty of the debugging is low and costs of the debugging are much lower than costs of debugging the cavity filter. The dielectrics are most preferably air media which have a simple production process and low costs. In addition, the dielectrics may be plastic cement, PVC, ceramics, or the like.

Specifically, the conductive isolating cavity is formed by a conductive housing 110 having an avoidance hole 111, and the coil 200 is hung and disposed in the housing and is connected to the outside of the conductive housing 110 through the avoidance hole 111. The coil 200 may be partially extended to the outside of the conductive housing 110 through the avoidance hole 111 to be connected to a signal source, or may be connected to a signal source outside the conductive housing 110 by using a conductor such as a conducting wire through the avoidance hole 111, and the conducting wire may be connected to any location of the coil 200, for example, the middle of the coil 200 or an end part of the coil 200.

Embodiment 2

Figure 2:
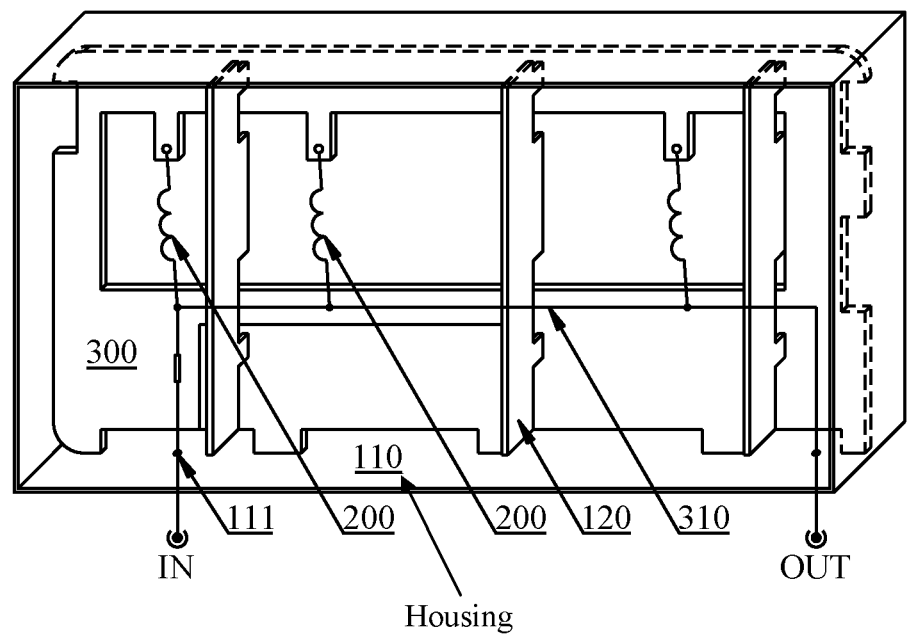
FIG. 2 is a schematic diagram of a filter for suppressing 5G signal interference according to Embodiment 2.

As shown in FIG. 2, a filter for suppressing 5G signal interference comprises several high-frequency filter circuits connected in parallel that use a coil 200 hung and disposed in a conductive isolating cavity as an inductor and that use a combination of the conductive isolating cavity, dielectrics in the conductive isolating cavity, and the coil 200 as a capacitor.

This embodiment provides a new-type filter circuit, comprising a conductive isolating cavity, dielectrics in the conductive isolating cavity, and a coil 200 hung and disposed in the conductive isolating cavity. The coil 200 itself is an inductor in a high-frequency filter circuit. In addition, the coil 200 and the conductive isolating cavity further form two conductors close to each other, and air media or other types of dielectrics in relatively small space between the two conductors form non-conductive insulated media, to jointly form a new-type capacitor. In brief, the coil 200 in the high-frequency filter circuit is both an inductor and a conductor that forms a capacitor. A distribution parameter formed by using the coil, the conductive isolating cavity, and the dielectrics in the conductive isolating cavity is capacitance. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the capacitor is much less than a volume of a cavity filter, which meets a need of miniaturization development of a filter; and the high-frequency filter circuit can be easily debugged by adjusting tension of the coil 200, and difficulty of the debugging is low and costs of the debugging are much lower than costs of debugging the cavity filter. Several high-frequency filter circuits are connected in parallel to achieve a better suppression effect, so that resonance frequency of each high-frequency filter circuit is around 700 MHz, and the resonance frequencies of each of the high-frequency filter circuits are slightly different, thereby facilitating in further improving a 5G suppression effect. so that resonance frequency of each high-frequency filter circuit is around 700 MHz, and the resonance frequencies of each of the high-frequency filter circuits are slightly different, thereby facilitating in further improving a 5G suppression effect. The dielectrics are most preferably air media which have a simple production process and low costs. In addition, the dielectrics may be plastic cement, PVC, ceramics, or the like.

Figure 3:
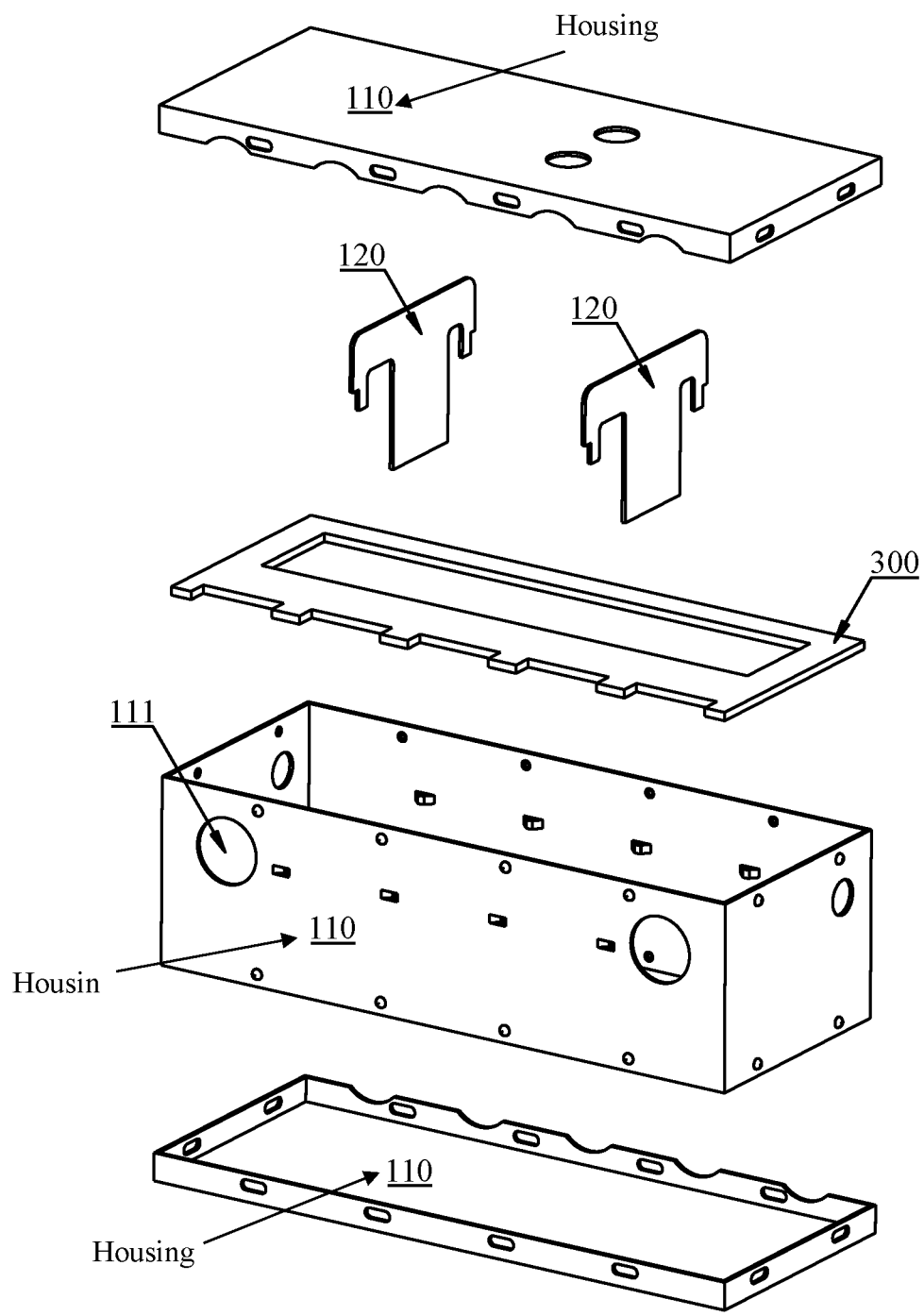
FIG. 3 is an exploded view of a filter for suppressing 5G signal interference according to Embodiment 2.

Specifically, as shown in FIG. 3, the filter comprises a conductive housing 110 having two avoidance holes 111, conductive separators 120 that separate the conductive housing 110 into several conductive isolating cavities, and a circuit board 300 having a transmission line 310 crossing several conductive isolating cavities, a coil 200 of each high-frequency filter circuit being disposed in each conductive isolating cavity with one end being connected to the transmission line 310, and two ends of the transmission line 310 being separately connected to the outside of the conductive housing 110 through the two avoidance holes 111.

Embodiment 3

Figure 4:
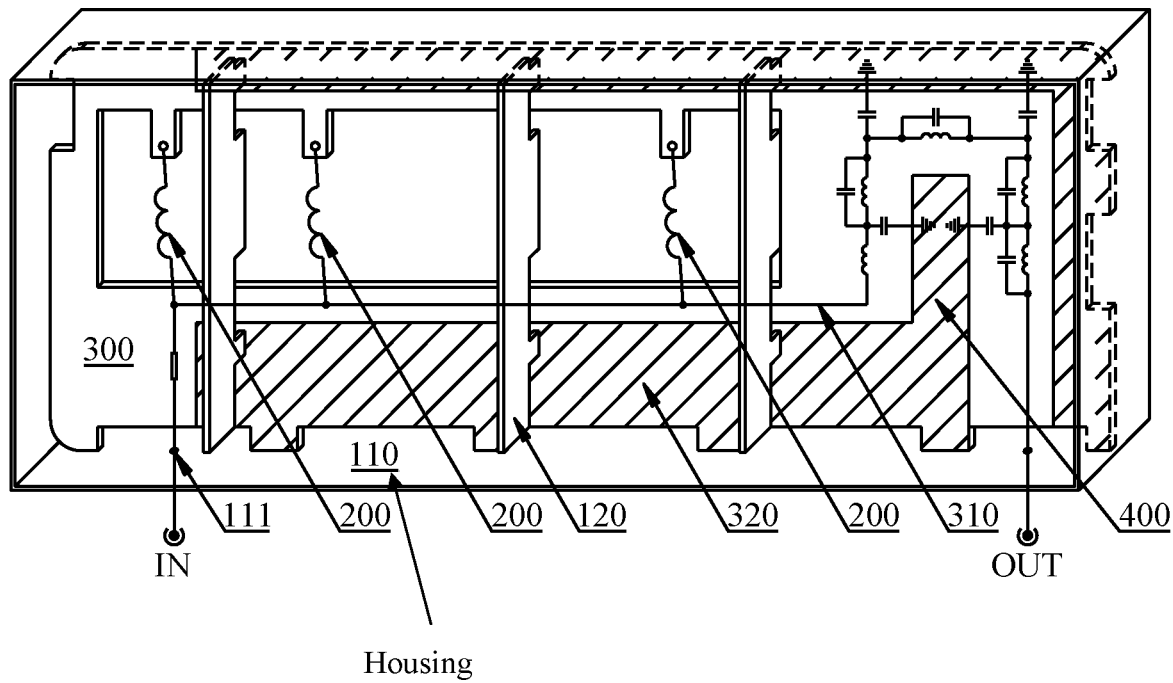
FIG. 4 is a schematic diagram of a filter for suppressing 5G signal interference according to Embodiment 3.

As an improved solution of Embodiment 2, as shown in FIG. 4, the two ends of the transmission line 310 are respectively a signal input end and a signal output end, and a location on the transmission line 310 close to the signal output end is further connected to an LC filter circuit disposed on the circuit board 300. An LC filter circuit being added after the high-frequency filter circuit can then filter out a high frequency lower than a frequency of a 5G signal, which helps to improve signal quality. Preferably, the LC filter circuit is a low-pass filter circuit 400, comprising several parallel resonance circuits connected in series. A low-pass filter circuit 400 being added after the high-frequency filter circuit can then filter out frequencies above 750 MHz, which helps to achieve a signal of higher quality. The circuit board 300 further has a grounding line 320 wound and disposed round an edge of the circuit board 300, the grounding line 320 being connected to the conductive housing 110, to ensure that the circuit board and the conductive housing are properly grounded.

Embodiment 4

Figure 5:
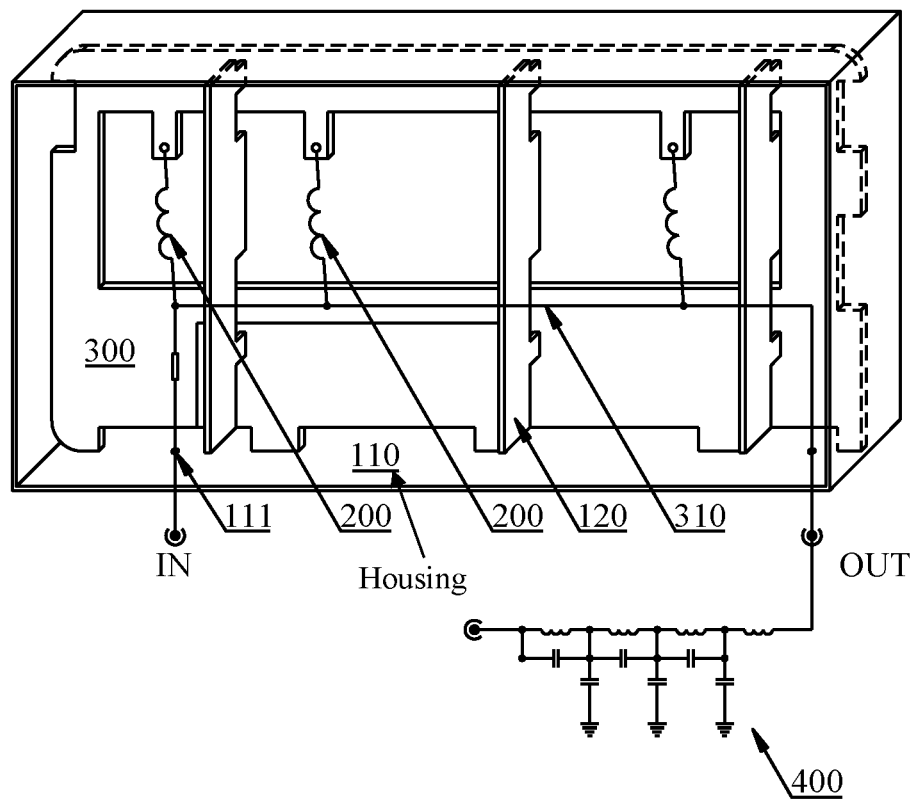
FIG. 5 is a schematic diagram of a filter for suppressing 5G signal interference according to Embodiment 4.

As an improved solution of Embodiment 2, as shown in FIG. 5, the two ends of the transmission line 310 are respectively a signal input end and a signal output end, and the signal output end is further connected to an LC filter circuit. An LC filter circuit being added after the high-frequency filter circuit can then filter out a high frequency lower than a frequency of a 5G signal, which helps to improve signal quality. Preferably, the LC filter circuit is a low-pass filter circuit 400, comprising several parallel resonance circuits connected in series. A low-pass filter circuit 400 being added after the high-frequency filter circuit can then filter out frequencies above 750 MHz, which helps to achieve a signal of higher quality. The circuit board 300 further has a grounding line 320 wound and disposed round an edge of the circuit board 300, the grounding line 320 being connected to the conductive housing 110, to ensure that the circuit board and the conductive housing are properly grounded.

Embodiment 5

Figure 6:
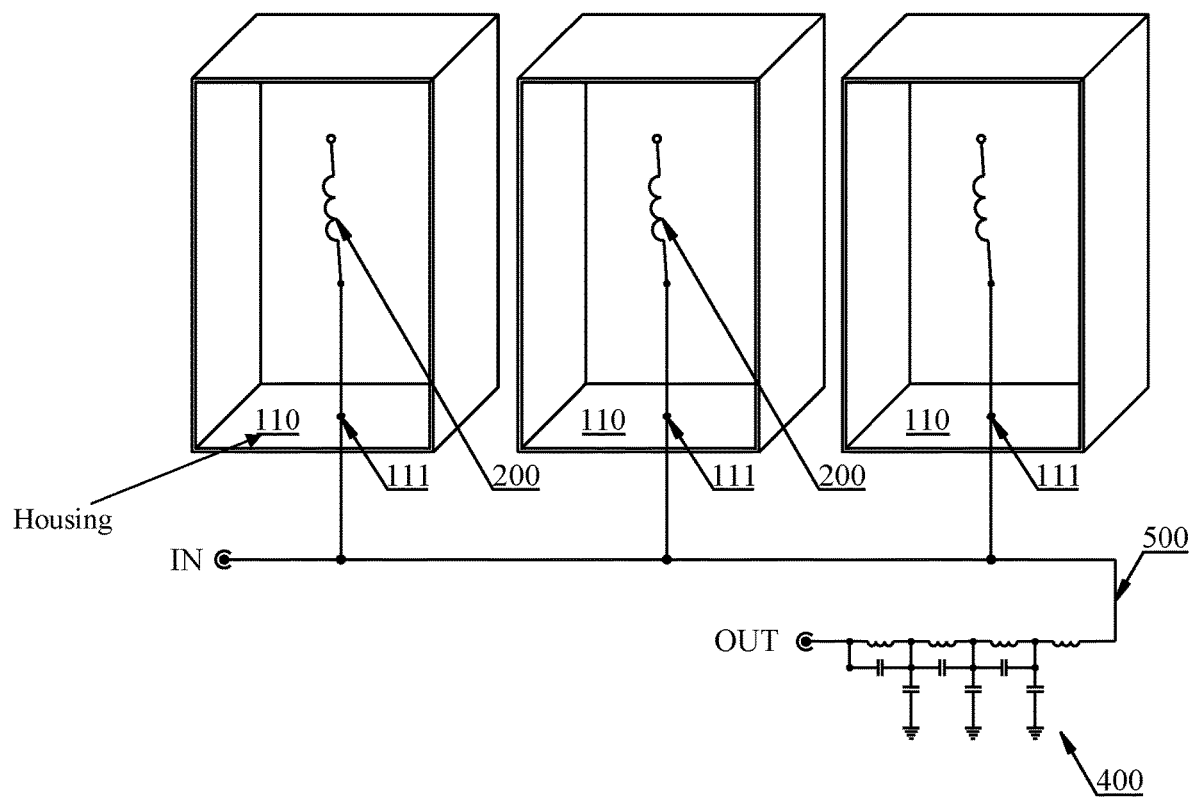
FIG. 6 is a schematic diagram of a filter for suppressing 5G signal interference according to Embodiment 5.

As shown in FIG. 6, a filter for suppressing 5G signal interference comprises several high-frequency filter circuits connected in parallel that use a coil 200 hung and disposed in a conductive isolating cavity as an inductor and that use a combination of the conductive isolating cavity, dielectrics in the conductive isolating cavity, and the coil 200 as a capacitor.

This embodiment provides a new-type filter circuit, comprising a conductive isolating cavity, dielectrics in the conductive isolating cavity, and a coil 200 hung and disposed in the conductive isolating cavity. The coil 200 itself is an inductor in a high-frequency filter circuit. In addition, the coil 200 and the conductive isolating cavity further form two conductors close to each other, and air media or other types of dielectrics in relatively small space between the two conductors form non-conductive insulated media, to jointly form a new-type capacitor. In brief, the coil 200 in the high-frequency filter circuit is both an inductor and a conductor that forms a capacitor. A distribution parameter formed by using the coil, the conductive isolating cavity, and the dielectrics in the conductive isolating cavity is capacitance. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the capacitor is much less than a volume of a cavity filter, which meets a need of miniaturization development of a filter; and the high-frequency filter circuit can be easily debugged by adjusting tension of the coil 200, and difficulty of the debugging is low and costs of the debugging are much lower than costs of debugging the cavity filter. Several high-frequency filter circuits are connected in parallel to achieve a better suppression effect, so that resonance frequency of each high-frequency filter circuit is around 700 MHz, and the resonance frequencies of each of the high-frequency filter circuits are slightly different, thereby facilitating in further improving a 5G suppression effect. so that resonance frequency of each high-frequency filter circuit is around 700 MHz, and the resonance frequencies of each of the high-frequency filter circuits are slightly different, thereby facilitating in further improving a 5G suppression effect. The dielectrics are most preferably air media which have a simple production process and low costs. In addition, the dielectrics may be plastic cement, PVC, ceramics, or the like.

Specifically, the conductive isolating cavity is formed by a conductive housing 110 having an avoidance hole 111, and the coil 200 is hung and disposed in the housing and is connected to the outside of the conductive housing 110 through the avoidance hole 111. The coil 200 may be partially extended to the outside of the conductive housing 110 through the avoidance hole 111 to be connected to a signal source, or may be connected to a signal source outside the conductive housing 110 by using a conductor such as a conducting wire through the avoidance hole 111, and the conducting wire may be connected to any location of the coil 200, for example, the middle of the coil 200 or an end part of the coil 200. During parallel connection, the coil 200 connected to the outside of the conductive housing 110 is connected one by one in parallel to a transmission wire 500 connected to a signal source.

Two ends of the transmission wire 500 are respectively a signal input end and a signal output end, and the signal output end is further connected to an LC filter circuit. An LC filter circuit being added after the high-frequency filter circuit can then filter out a high frequency lower than a frequency of a 5G signal, which helps to improve signal quality. Preferably, the LC filter circuit is a low-pass filter circuit 400, comprising several parallel resonance circuits connected in series. A low-pass filter circuit 400 being added after the high-frequency filter circuit can then filter out frequencies above 750 MHz, which helps to achieve a signal of higher quality.

Embodiment 6

Figure 7:
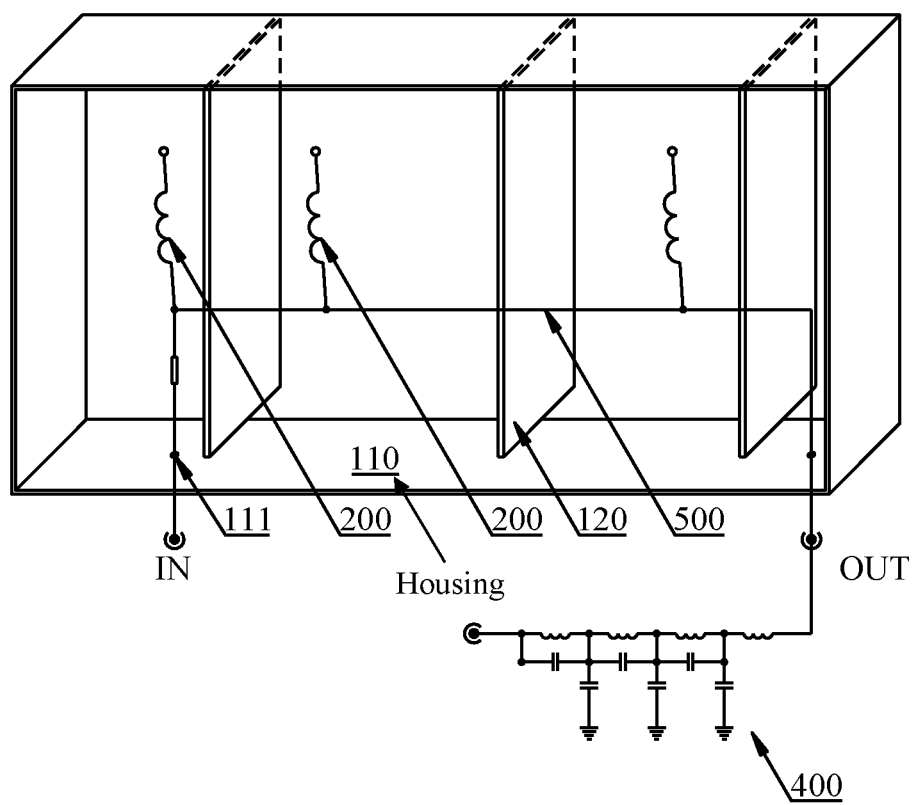
FIG. 7 is a schematic diagram of a filter for suppressing 5G signal interference according to Embodiment 6.

As shown in FIG. 7, a filter for suppressing 5G signal interference comprises several high-frequency filter circuits connected in parallel that use a coil 200 hung and disposed in a conductive isolating cavity as an inductor and that use a combination of the conductive isolating cavity, dielectrics in the conductive isolating cavity, and the coil 200 as a capacitor.

This embodiment provides a new-type filter circuit, comprising a conductive isolating cavity, dielectrics in the conductive isolating cavity, and a coil 200 hung and disposed in the conductive isolating cavity. The coil 200 itself is an inductor in a high-frequency filter circuit. In addition, the coil 200 and the conductive isolating cavity further form two conductors close to each other, and air media or other types of dielectrics in relatively small space between the two conductors form non-conductive insulated media, to jointly form a new-type capacitor. In brief, the coil 200 in the high-frequency filter circuit is both an inductor and a conductor that forms a capacitor. A distribution parameter formed by using the coil, the conductive isolating cavity, and the dielectrics in the conductive isolating cavity is capacitance. A large number of experiments prove that an effect of suppressing a frequency higher than 700 MHz by the high-frequency filter circuit is explicitly better than an effect of suppressing a frequency higher than 700 MHz by an ordinary LC filter circuit, and a volume of the conductive isolating cavity, namely, another conductor forming the capacitor is much less than a volume of a cavity filter, which meets a need of miniaturization development of a filter; and the high-frequency filter circuit can be easily debugged by adjusting tension of the coil 200, and difficulty of the debugging is low and costs of the debugging are much lower than costs of debugging the cavity filter. Several high-frequency filter circuits are connected in parallel to achieve a better suppression effect, so that resonance frequency of each high-frequency filter circuit is around 700 MHz, and the resonance frequencies of each of the high-frequency filter circuits are slightly different, thereby facilitating in further improving a 5G suppression effect. so that resonance frequency of each high-frequency filter circuit is around 700 MHz, and the resonance frequencies of each of the high-frequency filter circuits are slightly different, thereby facilitating in further improving a 5G suppression effect. The dielectrics are most preferably air media which have a simple production process and low costs. In addition, the dielectrics may be plastic cement, PVC, ceramics, or the like.

Specifically, the filter comprises a conductive housing 110 having two avoidance holes 111, conductive separators 120 that separate the conductive housing 110 into several conductive isolating cavities, and a transmission wire 500 crossing several conductive isolating cavities, a coil 200 of each high-frequency filter circuit being disposed in each conductive isolating cavity with one end being connected to the transmission wire 500, and two ends of the transmission wire 500 being separately connected to the outside of the conductive housing 110 through the two avoidance holes 111.

Two ends of the transmission wire 500 are respectively a signal input end and a signal output end, and the signal output end is further connected to an LC filter circuit. An LC filter circuit being added after the high-frequency filter circuit can then filter out a high frequency lower than a frequency of a 5G signal, which helps to improve signal quality. Preferably, the LC filter circuit is a low-pass filter circuit 400, comprising several parallel resonance circuits connected in series. A low-pass filter circuit 400 being added after the high-frequency filter circuit can then filter out frequencies above 750 MHz, which helps to achieve a signal of higher quality.

As a preferred solution of Embodiment 1 to embodiment 6, a wire diameter of the coil 200 is 0.5 mm to 1.2 mm, and an inter-loop diameter of the coil 200 is 3 mm to 6 mm. The use of a thick coil 200 is not only advantageous for further improving a suppression effect, but also for obtaining a high-Q value high-frequency filter circuit. Preferably, a copper coil 200 is used for the coil 200. The number of turns of the coil 200 is 5 to 13, preferably, the number of turns of the coil is 6 to 9, and a small number of turns leads to a larger diameter of the coil. It is found that a larger number of turns of the coil lead to a lower resonance frequency and a poorer received antenna signal, and in such a case, even no antenna signal can be received, and an optimal filtering effect can be achieved by designing the number of turns of the coil to 9; and if the number of turns of the coil is too small, frequencies above 700 MHz cannot be filtered out, so that 5G signal interference cannot be suppressed. When the number of turns of the coil is within the above range, a television signal can be effectively received and 5G signal interference can be effectively suppressed.

As a specific application of the above embodiments: a television antenna comprises an antenna radiator and the above filter for suppressing 5G signal interference. The filter for suppressing 5G signal interference according to the present invention can be internally or externally arranged and connected to the antenna radiator receiving a television signal, and interference from a 5G signal with the television signal can be suppressed, so that a user can effectively receive a smooth television signal in a 5G environment.

Obviously, the above embodiments of the present invention are merely embodiments used for clearly describing the present invention, instead of limiting the implementation modes of the present invention. For a person skilled in the art, other forms of changes or variations may also be made on the basis of the above illustration. There is no need and no way to exhaust all implementation modes here. Within the spirit and principle of the present invention, any modifications, equivalent replacements, improvements, etc., shall be comprised within the scope of protection of the present invention.

What is claimed is:

1. A filter for suppressing 5G signal interference, comprising a high-frequency filter circuit that uses a coil hung and disposed in a conductive isolating cavity as an inductor and that uses a combination of the conductive isolating cavity, dielectrics in the conductive isolating cavity, and the coil as a capacitor.

2. The filter for suppressing 5G signal interference according to claim 1, wherein the dielectrics are air media.

3. The filter for suppressing 5G signal interference according to claim 1, wherein the conductive isolating cavity is formed by a conductive housing having an avoidance hole, and the coil is hung and disposed in the conductive housing and is connected to the outside of the conductive housing through the avoidance hole.

4. The filter for suppressing 5G signal interference according to claim 1, comprising several high-frequency filter circuits connected in parallel.

5. The filter for suppressing 5G signal interference according to claim 4, further comprising a conductive housing having two avoidance holes, conductive separators that separate the conductive housing into several conductive isolating cavities, and a circuit board having a transmission line crossing several conductive isolating cavities, a respective coil of each high-frequency filter circuit being hung and disposed in each conductive isolating cavity with one end being connected to the transmission line, and two ends of the transmission line being separately connected to the outside of the conductive housing through the two avoidance holes.

6. The filter for suppressing 5G signal interference according to claim 5, wherein the two ends of the transmission line are respectively a signal input end and a signal output end, and the signal output end or a location on the transmission line close to the signal output end is further connected to an LC filter circuit.

7. The filter for suppressing 5G signal interference according to claim 6, wherein the LC filter circuit is a low-pass filter circuit, comprising several parallel resonance circuits connected in series.

8. The filter for suppressing 5G signal interference according to claim 6, wherein the circuit board further has a grounding line wound and disposed round an edge of the circuit board, the grounding line being connected to the conductive housing.

9. The filter for suppressing 5G signal interference according to claim 1, wherein a wire diameter of the coil is 0.5 mm to 1.2 mm, an inter-loop diameter of the coil is 3 mm to 6 mm, and the number of turns of the coil is 5 to 13.

10. A television antenna, comprising an antenna radiator and the filter for suppressing 5G signal interference according to claim 1.

* * * * *

UNITED STATES PATENT AND TRADEMARK OFFICE
CERTIFICATE OF CORRECTION

PATENT NO. : 10,897,237 B1
APPLICATION NO. : 16/600791
DATED : January 19, 2021
INVENTOR(S) : Ruidian Yang Page 1 of 1

It is certified that error appears in the above-identified patent and that said Letters Patent is hereby corrected as shown below:

On the Title Page

(30) Foreign Application Priority Data:
"Sep. 11, 2019 (CN) …… 2019 2 1517294 U"
Should read:
-- Sep. 11, 2019 (CN) …… 2019 2 1517294 X --

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*